United States Patent
Hosokawa et al.

(10) Patent No.: US 12,207,376 B2
(45) Date of Patent: Jan. 21, 2025

(54) HIGH-FREQUENCY HEATING APPARATUS

(71) Applicant: Panasonic Intellectual Property Management Co., Ltd., Osaka (JP)

(72) Inventors: Daisuke Hosokawa, Shiga (JP); Takashi Uno, Shiga (JP); Fumitaka Ogasawara, Hyogo (JP); Koji Yoshino, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 736 days.

(21) Appl. No.: 17/294,411

(22) PCT Filed: Oct. 25, 2019

(86) PCT No.: PCT/JP2019/042040
§ 371 (c)(1),
(2) Date: May 16, 2021

(87) PCT Pub. No.: WO2020/110546
PCT Pub. Date: Jun. 4, 2020

(65) Prior Publication Data
US 2022/0132631 A1  Apr. 28, 2022

(30) Foreign Application Priority Data

Nov. 30, 2018 (JP) .................. 2018-225571

(51) Int. Cl.
*H05B 6/50* (2006.01)
*A23L 3/00* (2006.01)
(Continued)

(52) U.S. Cl.
CPC ............. *H05B 6/50* (2013.01); *A23L 3/001* (2013.01); *A23L 3/365* (2013.01); *H03H 7/38* (2013.01); *A23V 2002/00* (2013.01)

(58) Field of Classification Search
CPC .............. H05B 6/46; H05B 6/48; H05B 6/50; H05B 6/54; H05B 6/62; H05B 6/64; H05B 6/66;
(Continued)

(56) References Cited

U.S. PATENT DOCUMENTS

2018/0042073 A1  2/2018  Scott et al.
2018/0110098 A1*  4/2018  Maruyama .............. H05B 6/54
(Continued)

FOREIGN PATENT DOCUMENTS

CN  107710869  2/2018
JP  2003-347034  12/2003
(Continued)

OTHER PUBLICATIONS

International Search Report of PCT application No. PCT/JP2019/042040 dated Dec. 10, 2019.
(Continued)

*Primary Examiner* — Quang T Van
(74) *Attorney, Agent, or Firm* — Wenderoth, Lind & Ponack, L.L.P.

(57) ABSTRACT

A high-frequency heating apparatus according to an embodiment of the present disclosure includes a heating chamber, an electrode, a high-frequency power supply, at least one matching element, and a controller. The heating chamber accommodates a heating target. The high-frequency power supply applies a high-frequency voltage to the electrode. The impedance matcher includes at least one matching element having a matching constant that is variable. The controller stops the high-frequency power supply to complete heating based on a temporal change of the matching constant of the at least one matching element. In this embodiment, a heating target can be heated efficiently.

9 Claims, 7 Drawing Sheets

(51) Int. Cl.
*A23L 3/365* (2006.01)
*H03H 7/38* (2006.01)

(58) Field of Classification Search
CPC .......... H05B 6/68; H05B 6/687; H05B 6/688; H03H 7/38
USPC ................ 219/779, 780, 770, 760, 761, 746
See application file for complete search history.

(56) References Cited

U.S. PATENT DOCUMENTS

2019/0191501 A1* 6/2019 Piel ...................... F25D 21/002
2020/0214094 A1 7/2020 Scott et al.

FOREIGN PATENT DOCUMENTS

| JP | 2004-342436 | | 12/2004 |
| JP | 2005-056781 | | 3/2005 |
| JP | 2005056781 A | * | 3/2005 |
| JP | 2018-022677 | | 2/2018 |
| JP | 2019-032963 | | 2/2019 |

OTHER PUBLICATIONS

English Translation of Chinese Search Report issued Jan. 20, 2023 in related Chinese Patent Application No. 201980077893.0.

* cited by examiner

HIGH-FREQUENCY HEATING APPARATUS

TECHNICAL FIELD

The present disclosure relates to a high-frequency heating apparatus.

BACKGROUND ART

A thawing system disclosed in Patent Literature 1, for example, is known as a high-frequency heating apparatus.

The thawing system disclosed in Patent Literature 1 repeatedly determines a calculated rate of change based on a forward RF power measurement and a reflected RF power measurement, and repeatedly compares the calculated rate of change to a threshold rate of change.

The thawing system of Patent Literature 1 continues to provide a radio frequency (RF) signal to an electrode when the calculated rate of change compares favorably with the threshold rate of change. When the thawing operation is completed, the thawing system ceases to provide the RF signal to the electrode.

CITATION LIST

Patent Literature

PTL 1: Japanese Patent Unexamined Publication No. 2018-22677

SUMMARY

However, there still remains room for improvement in the apparatus disclosed in Patent Literature 1 from the viewpoint of heating the heating target efficiently.

A high-frequency heating apparatus according to an embodiment of the present disclosure includes a heating chamber, an electrode, a high-frequency power supply, at least one matching element, and a controller. The heating chamber accommodates a heating target. The high-frequency power supply applies a high-frequency voltage to the electrode. The impedance matcher includes at least one matching element having a matching constant that is variable. The controller stops the high-frequency power supply to complete heating based on a temporal change of the matching constant of the at least one matching element.

In this embodiment, a heating target can be heated efficiently.

DESCRIPTION OF EMBODIMENTS

Figure 1:
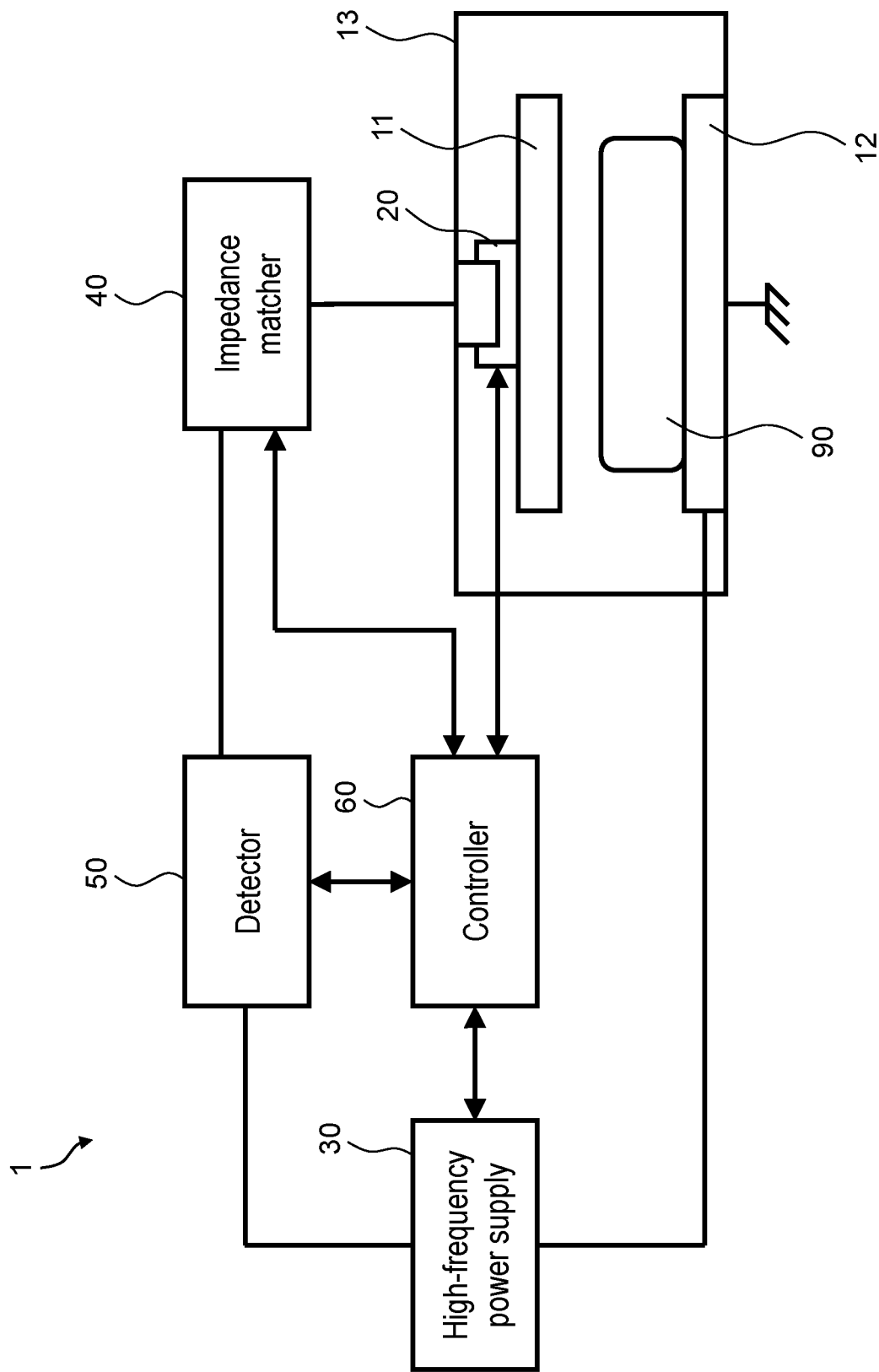
FIG. 1 is a schematic view illustrating the configuration of a high-frequency heating apparatus according to an exemplary embodiment of the present disclosure.

Findings that Established the Foundation of the Present Disclosure

The above-described conventional thawing system determines that heating is completed when the rate of change calculated from the forward RF power measurement and the reflected RF power measurement is greater than or equal to a predetermined threshold value for a heating target placed in the heating chamber.

In this determination process, the determination is made based on an increase of the reflected RF power. For this reason, as completion of the heating approaches, an impedance mismatch occurs between the high-frequency power supply and the electrode on the load side. As a consequence, heating efficiency decreases toward the end of heating.

In cases where there are variations in the position, shape, and mass of the heating target, the end of heating may not be determined appropriately when an arbitrary fixed threshold value is used. It is difficult to set an appropriate threshold value in accordance with variations in the position, shape, and mass of the heating target.

The present inventors have discovered that the end of heating can be determined based on a matching constant of an impedance matcher.

A high-frequency heating apparatus according to a first aspect of the present disclosure includes a heating chamber, an electrode, a high-frequency power supply, at least one matching element, and a controller. The heating chamber accommodates a heating target. The high-frequency power supply applies a high-frequency voltage to the electrode. The impedance matcher includes at least one matching element having a matching constant that is variable. The controller stops the high-frequency power supply to complete heating based on a temporal change of the matching constant of the at least one matching element.

In a high-frequency heating apparatus according to a second aspect of the present disclosure, in addition to the first aspect, the at least one matching element includes at least one of a variable capacitor having a variable capacitance and a variable inductor having a variable inductance.

In a high-frequency heating apparatus according to a third aspect of the present disclosure, in addition to the first aspect, the at least one matching element includes a plurality of capacitors. The impedance matcher changes the matching constant by selectively connecting the plurality of capacitors.

In a high-frequency heating apparatus according to a fourth aspect of the present disclosure, in addition to the first aspect, the at least one matching element includes a plurality of inductors. The impedance matcher changes the matching constant by selectively connecting the plurality of inductors.

In a high-frequency heating apparatus according to a fifth aspect of the present disclosure, in addition to the first aspect, the impedance matcher includes at least one matching element connected in series to the electrode, and at least one matching element connected in parallel to the electrode.

In a high-frequency heating apparatus according to a sixth aspect of the present disclosure, in addition to the first aspect, the at least one matching element is connected in series to the electrode.

In a high-frequency heating apparatus according to a seventh aspect of the present disclosure, in addition to the first aspect, the at least one matching element is connected in parallel to the electrode.

In a high-frequency heating apparatus according to an eighth aspect of the present disclosure, in addition to the first aspect, the impedance matcher changes the matching constant of the at least one matching element from start to end of heating, to suppress a reflected wave from the electrode to the high-frequency power supply.

In a high-frequency heating apparatus according to a ninth aspect of the present disclosure, in addition to the first aspect, the controller stops the high-frequency power supply when a rate of temporal change of the matching constant is less than or equal to a predetermined threshold value.

In a high-frequency heating apparatus according to a tenth aspect of the present disclosure, in addition to the first aspect, the controller stops the high-frequency power supply when the matching constant does not change for 20 seconds or more, or for $1/10$ of a time during which heating is being performed.

In a high-frequency heating apparatus according to an eleventh aspect, in addition to the first aspect, the controller estimates an end time of heating from the temporal change of the matching constant and stops the high-frequency power supply earlier than the estimated end time.

Hereafter, exemplary embodiments of the present disclosure will be described with reference to the appended drawings.

Overall Configuration

FIG. 1 is a schematic view illustrating the configuration of high-frequency heating apparatus 1 according to an exemplary embodiment of the present disclosure. As illustrated in FIG. 1, high-frequency heating apparatus 1 includes first electrode 11, second electrode 12, heating chamber 13, position adjuster 20, high-frequency power supply 30, impedance matcher 40, detector 50, and controller 60.

In the present exemplary embodiment, first electrode 11, second electrode 12, and position adjuster 20 are disposed in heating chamber 13. Heating target 90 is placed on second electrode 12 and between first electrode 11 and second electrode 12. Heating target 90 is a dielectric material, such as a food, with a uniform thickness.

In the present exemplary embodiment, high-frequency heating apparatus 1 includes position adjuster 20. However, position adjuster 20 is not essential in the present exemplary embodiment.

High-frequency heating apparatus 1 applies a high-frequency voltage to first electrode 11 to generate an electric field between first electrode 11 and second electrode 12 and thereby dielectrically heat heating target 90, which is placed between first electrode 11 and second electrode 12. Thus, high-frequency heating apparatus 1 performs heating or thawing of heating target 90.

First Electrode

First electrode 11 is a flat-shaped electrode having a rectangular shape, which is disposed in an upper part of heating chamber 13.

Second Electrode

Second electrode 12 is a flat-shaped electrode having a rectangular shape. Second electrode 12 is disposed on a bottom surface of heating chamber 13 so as to face first electrode 11.

Position Adjuster

Position adjuster 20 is disposed on the ceiling of heating chamber 13. Position adjuster 20 adjusts the distance between first electrode 11 and second electrode 12 in accordance with an instruction from controller 60.

Position adjuster 20 includes, for example, a motor disposed on the ceiling of heating chamber 13, and a connecting member connecting the motor to first electrode 11. When the motor rotates, the connecting member causes first electrode 11 to move vertically. The connecting member may be, for example, a rod-shaped member or a wire.

High-Frequency Power Supply

Figure 2:
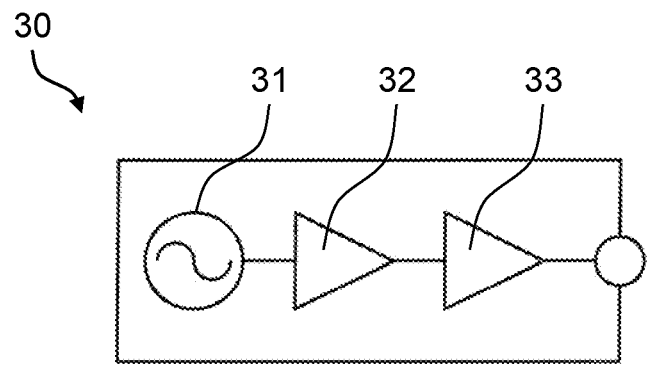
FIG. 2 is a schematic view illustrating the configuration of a high-frequency power supply according to an exemplary embodiment.

High-frequency power supply 30 is connected to first electrode 11 via impedance matcher 40 and detector 50 to apply a high-frequency voltage between first electrode 11 and second electrode 12. FIG. 2 is a schematic view illustrating a configuration of high-frequency power supply 30. As illustrated in FIG. 2, high-frequency power supply 30 includes high-frequency oscillator 31, amplifier 32, and amplifier 33.

High-frequency oscillator 31 emits a voltage signal having a frequency within a HF to VHF band. Amplifier 32 amplifies the voltage signal emitted from high-frequency oscillator 31. Amplifier 33 further amplifies the voltage signal amplified by amplifier 32. As a result, high-frequency power supply 30 is able to generate a desired high-frequency voltage.

High-frequency power supply 30 applies a high-frequency voltage between first electrode 11 and second electrode 12 to thereby generate an electric field between first electrode 11 and second electrode 12. This electric field causes heating target 90, which is disposed between first electrode 11 and second electrode 12, to be dielectrically heated.

Impedance Matcher

As illustrated in FIG. 1, impedance matcher 40 is disposed between first electrode 11 and high-frequency power supply 30. Impedance matcher 40 performs impedance matching between high-frequency power supply 30 and heating chamber 13. Impedance matcher 40 may be composed of, for example, an electric circuit.

Figure 3:
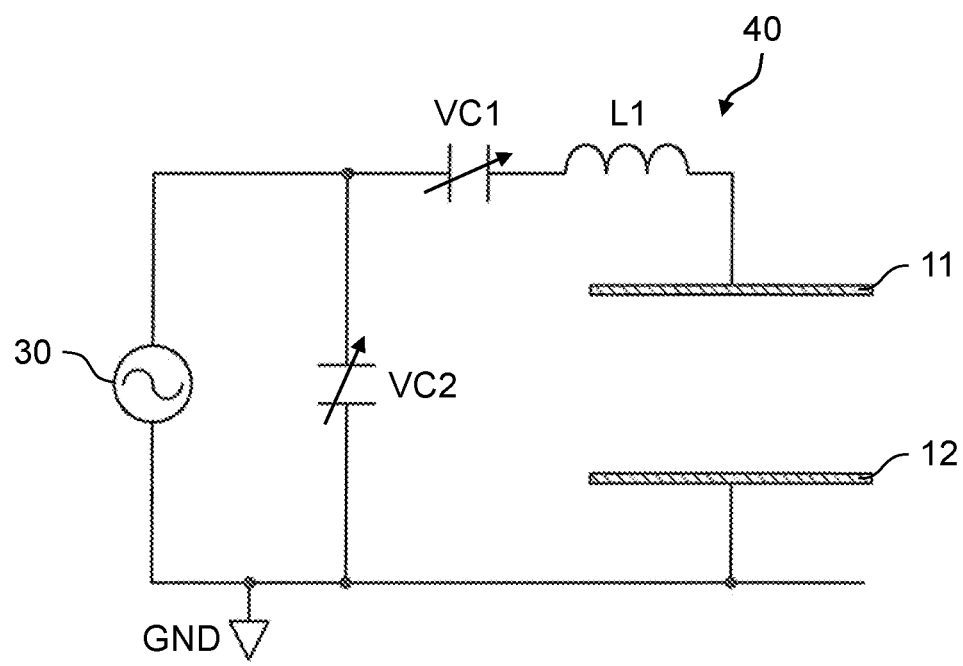
FIG. 3 is a schematic view illustrating the configuration of a circuit model containing an impedance matcher in an exemplary embodiment.

FIG. 3 is a schematic view illustrating the configuration of a circuit model containing impedance matcher 40. As illustrated in FIG. 3, impedance matcher 40 includes a plurality of matching elements each having a matching constant that is variable. The matching element is, for example, at least one of a variable capacitor having a variable capacitance and a variable inductor having a variable inductance.

The matching constant is a constant of the matching element that is adjusted in order to perform impedance matching. For example, when the matching element is a variable capacitor, the matching constant is capacitance. When the matching element is a variable inductor, the matching constant is inductance.

In the present exemplary embodiment, impedance matcher 40 includes first variable capacitor VC1 and second variable capacitor VC2 as the matching elements. Impedance matcher 40 further includes inductor L1.

First variable capacitor VC1 is connected in series to first electrode 11. Second variable capacitor VC2 is connected in parallel to first electrode 11 and second electrode 12. Inductor L1 is connected in series to first variable capacitor VC1 and first electrode 11.

Controller 60 varies the capacitances of first variable capacitor VC1 and second variable capacitor VC2. This enables impedance matcher 40 to perform impedance matching.

In the present exemplary embodiment, controller 60 varies the capacitances of first variable capacitor VC1 and second variable capacitor VC2 so that the reflected wave detected by detector 50 becomes smaller. The reflected wave is produced when there is an impedance mismatch between the impedance of high-frequency power supply 30 and the impedance of the inside of heating chamber 13 including first electrode 11 and second electrode 12.

For example, when the output impedance of high-frequency power supply 30 is 50Ω, the combined impedance of the impedance of impedance matcher 40 and the impedance of the inside of heating chamber 13 needs to be brought closer to 50Ω. Meanwhile, with the progress of heating, the condition of heating target 90 changes, and accordingly, the impedance of the inside of heating chamber 13 changes.

Controller 60 varies the capacitances of first variable capacitor VC1 and second variable capacitor VC2 in accordance with the variation of the impedance of the inside of heating chamber 13. This serves to maintain the combined impedance of the impedance of impedance matcher 40 and the impedance of the inside of heating chamber 13. As a result, the reflected wave is minimized.

The capacitance of the inside of heating chamber 13 is described below. The capacitance of the inside of heating chamber 13 can be calculated from, for example, the capacitance of a parallel-plate capacitor formed by first electrode 11 and second electrode 12, the capacitance that is parasitic between a wall surface of heating chamber 13 and first electrode 11, and the like. More specifically, capacitance C of the inside of heating chamber 13 is expressed by the following equation.

$$C = C_0 + (C_g \times C_f)/(C_g + C_f)$$

Here, $C_0$ is the capacitance that is parasitic between a wall surface of heating chamber 13 and first electrode 11, $C_g$ is the capacitance of the space between first electrode 11 and heating target 90, and $C_f$ is the capacitance of heating target 90.

Moreover, capacitance $C_f$ of heating target 90 is expressed by the following equation.

$$C_f = \varepsilon \times S/d$$

Here, $C_f$ is the capacitance [F] of heating target 90, $\varepsilon$ is the dielectric constant [F/m], S is the electrode area [m$^2$], and d is the interelectrode distance [m]. The dielectric constant can be calculated by multiplying vacuum dielectric constant and relative dielectric constant.

As indicated by the foregoing equations, the capacitance of the inside of heating chamber 13 changes in accordance with the capacitance $C_f$ of heating target 90. The relative dielectric constant of ice is about 3, while the relative dielectric constant of water is about 70 to about 80. This means that when frozen heating target 90 is to be thawed, the dielectric constant of heating target 90 changes about 25 times from start to end of the heating.

Therefore, while heating target 90 is being heated, the capacitance of the inside of heating chamber 13 greatly changes in association with the change of the dielectric constant. When the thawing of heating target 90 ends, the dielectric constant becomes stable, and the capacitance of the inside of heating chamber 13 becomes stable.

Controller 60 varies the capacitances of first variable capacitor VC1 and second variable capacitor VC2 so that the combined impedance of the impedance of impedance matcher 40 and the impedance of the inside of heating chamber 13 is not changed.

In other words, when the capacitance of the inside of heating chamber 13 varies, the capacitances of first variable capacitor VC1 and second variable capacitor VC2 accordingly vary. When the capacitance of the inside of heating chamber 13 becomes stable, the capacitances of first variable capacitor VC1 and second variable capacitor VC2 also become stable.

Next, the combined impedance of the impedance of impedance matcher 40 and the impedance of the inside of heating chamber 13 is expressed by the following equation. Here, the combined impedance is represented by admittance, which is the reciprocal of impedance.

$$Y_{TOTAL} = j\omega(C_{VC2} + (1/((1/C_{VC1}) + (1/C) - (\omega^2 \times L1))))$$

Here, $Y_{TOTAL}$ is the combined admittance [S] of the admittance of impedance matcher 40 and the admittance of the inside of heating chamber 13, $C_{VC1}$ is the capacitance [F] of first variable capacitor VC1, $C_{VC2}$ is the capacitance [F] of second variable capacitor VC2, L1 is the inductance [H] of fixed inductor, and C is the capacitance [F] of the inside of heating chamber 13.

As indicated by the foregoing equation, as the capacitance $C_f$ increases with the progress of thawing of heating target 90, the capacitance C of the inside of heating chamber 13 increases accordingly. Therefore, controller 60 causes the capacitance $C_{VC1}$ of first variable capacitor VC1 to reduce, or causes the capacitance $C_{VC2}$ of second variable capacitor VC2 to reduce.

Controller 60 may adjust both the capacitances of first variable capacitor VC1 and second variable capacitor VC2 simultaneously. This serves to maintain the combined impedance of the impedance of impedance matcher 40 and the impedance of the inside of heating chamber 13 to be approximately 50Ω, taking into consideration the influence from the resistance components in heating target 90, the resistances of the wiring lines connecting the blocks to each other, and the like. As a result, the reflected wave from first electrode 11 to high-frequency power supply 30 is minimized, so that heating target 90 can be heated efficiently.

Note that in the just-described case, the capacitance $C_{VC1}$ of first variable capacitor VC1 and the capacitance $C_{VC2}$ of second variable capacitor VC2 affect each other. Therefore, when the capacitance C of the inside of heating chamber 13 increases, the variations of capacitances $C_{VC1}$ and $C_{VC2}$ are not established uniquely.

Detector

Detector 50 detects a reflected power proceeding from first electrode 11 to high-frequency power supply 30. Detector 50 may be composed of, for example, an electric circuit. When an impedance match is not provided between heating chamber 13 and high-frequency power supply 30 by impedance matcher 40, part of the electric power is not supplied to heating chamber 13 but is reflected toward high-frequency power supply 30. Detector 50 detects this reflected power.

Figure 4:
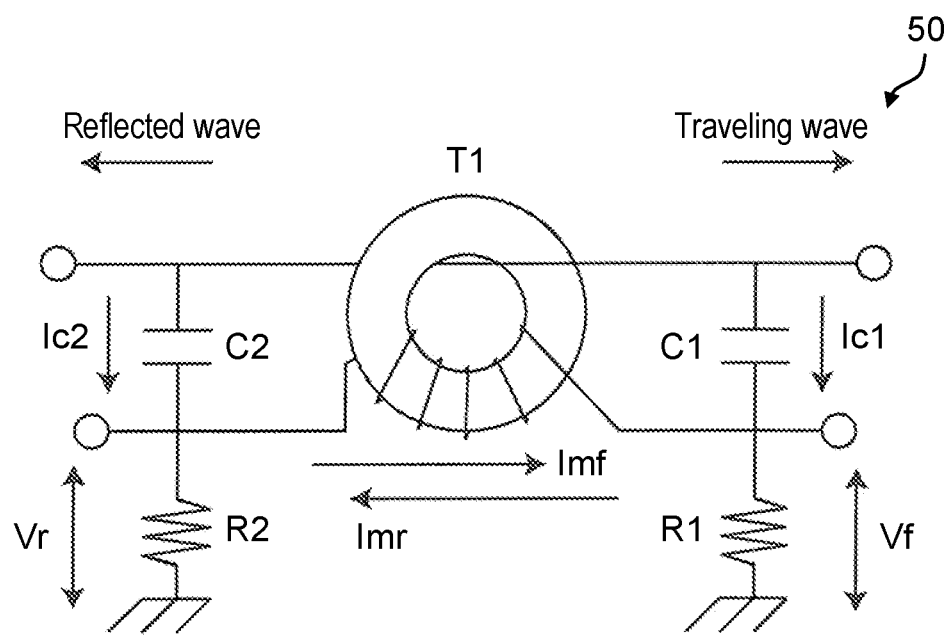
FIG. 4 is a schematic view illustrating the configuration of a detector in an exemplary embodiment.

FIG. 4 is a schematic view illustrating a configuration of detector 50. As illustrated in FIG. 4, in the present exemplary embodiment, detector 50 is a CM directional coupler, in which capacitive coupling (C) and inductive coupling (M) are combined.

Detector 50 includes transformer T1, capacitor C1, capacitor C2, resistor R1, and resistor R2. Transformer T1 is disposed at the center. Capacitors C1 and C2 are disposed on respective sides of transformer T1. Resistors R1 and R2 are connected in series to capacitors C1 and C2, respectively.

In FIG. 4, it is defined that a traveling wave flows from left to right and a reflected wave flows from right to left. Then, transformer T1 generates current Imf in accordance with the traveling wave and current Imr in accordance with the reflected wave. Capacitors C1 and C2 generate current Ic1 and Ic2, respectively.

Voltage Vf across resistor R1 and voltage Vr across resistor R2 are expressed by the following equations.

$$Vf = R1 \times (Ic1 + Imf - Imr)$$

$$Vr = R2 \times (Ic2 + Imr - Imf)$$

When the constants of the components are determined so that Ic1 is equal to Imr and Ic2 is equal to Imf, the circuit shown in FIG. 4 functions as a directional coupler. Detector 50 may be formed by a distributed constant line arranged on a circuit board pattern.

Controller

Controller 60 determines an end of heating when the temporal change of the matching constant of the matching element included in impedance matcher 40 becomes stable. For example, controller 60 causes high-frequency power supply 30 to stop to complete the heating when a rate of temporal change of a matching constant is less than or equal to a predetermined threshold value. The rate of temporal change means the rate of change per predetermined time (for example, 20 seconds).

The threshold value is a setpoint value for determining that the change of the matching constant is stable, which is set to, for example, greater than or equal to 0% and less than or equal to 0.5%. It is preferable that the threshold value be set to greater than or equal to 0% and less than or equal to 0.1%.

In the present exemplary embodiment, controller 60 causes high-frequency power supply 30 to stop to complete the heating based on temporal changes of the capacitances of first variable capacitor VC1 and second variable capacitor VC2.

Controller 60 is electrically connected to impedance matcher 40 and detector 50. Controller 60 controls the matching constant of a matching element included in impedance matcher 40 based on the reflected wave detected by detector 50. This enables impedance matcher 40 to perform impedance matching.

Controller 60 is electrically connected to position adjuster 20. Controller 60 causes position adjuster 20 to adjust the position of first electrode 11 in accordance with the height dimension of heating target 90.

Controller 60 includes, for example, a memory that stores a program and a processing circuit (not shown), which corresponds to a processor including a central processing unit (CPU). For example, in controller 60, the processor may execute the program stored in the memory.

Operation

The operations of high-frequency heating apparatus 1 according to the present exemplary embodiment will be described with reference to Examples 1 to 3 and Examples 4 to 6. In Examples 1 to 3, controller 60 determines the end of heating based on the temporal change of the capacitance of first variable capacitor VC1. In Examples 4 to 6, controller 60 determines the end of heating based on the temporal change of the capacitance of second variable capacitor VC2.

In Examples 1 to 3 and Examples 4 to 6, frozen minced beef was used as heating target 90. For Examples 1 and 4, heating target 90 had dimensions of 160 mm width×115 mm depth×25 mm height, and a weight of 300 g. For Examples 2 and 5, heating target 90 had dimensions of 195 mm width×145 mm depth×25 mm height, and a weight of 500 g. For Examples 3 and 6, heating target 90 had dimensions of 220 mm width×150 mm depth×35 mm height, and a weight of 1,000 g.

Controller 60 changes the capacitances of first variable capacitor VC1 and second variable capacitor VC2 simultaneously. This enables impedance matcher 40 to perform impedance matching.

Figure 5:
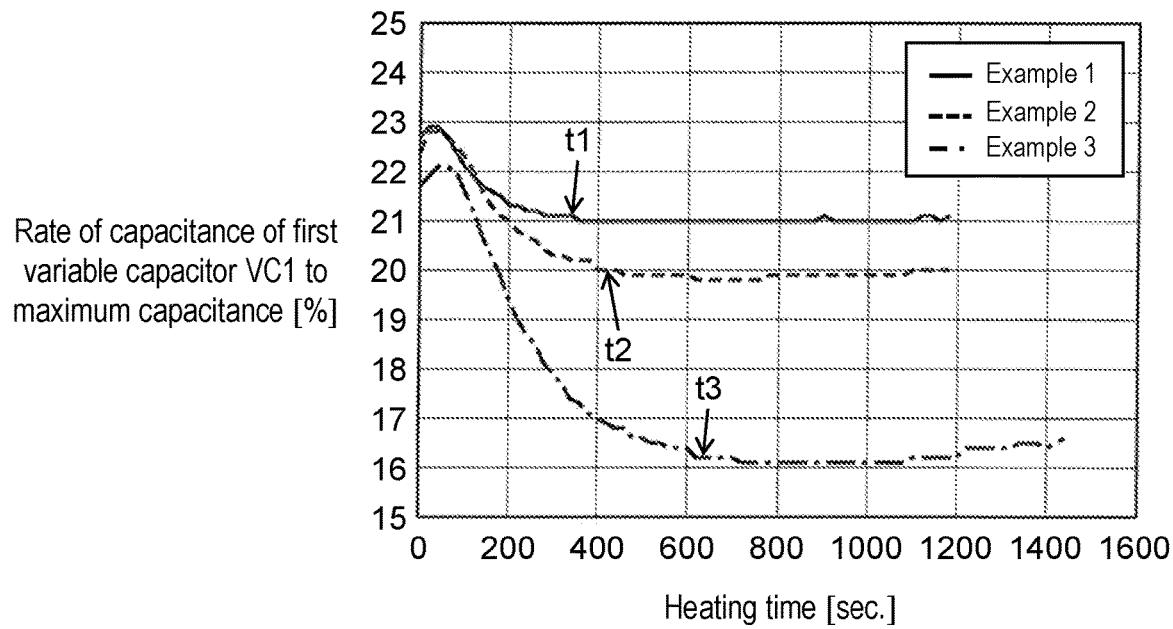
FIG. 5 is a graph showing a temporal change of the capacitance of first variable capacitor VC1 of Examples 1 to 3.

FIG. 5 shows a temporal change of the capacitance of first variable capacitor VC1 of Examples 1 to 3. Time points of the end of heating in Examples 1 to 3 are shown in FIG. 5.

More precisely, the vertical axis of FIG. 5 represents the rate (%) of capacitance of first variable capacitor VC1 that is determined by controller 60, with respect to the maximum capacitance of first variable capacitor VC1. As shown in FIG. 5, in Examples 1 to 3, the capacitance of first variable capacitor VC1 becomes stable with the progress of thawing of heating target 90. In other words, the rate of temporal change of the capacitance of first variable capacitor VC1 decreases.

In Examples 1 to 3, controller 60 determines the end of heating when the rate of temporal change of the capacitance of first variable capacitor VC1 reaches approximately 0%, more specifically, less than or equal to 0.1%. As shown in FIG. 5, in Example 1, the rate of temporal change of the capacitance of first variable capacitor VC1 is approximately 0% at time point t1, at which about 330 seconds have elapsed since the start of heating. At time point t1, controller 60 determines the end of heating.

In Example 2, the rate of temporal change of the capacitance of first variable capacitor VC1 is approximately 0% at time point t2, at which about 420 seconds have elapsed since the start of heating. At time point t2, controller 60 determines the end of heating. In Example 3, the rate of temporal change of the capacitance of first variable capacitor VC1 is approximately 0% at time point t3, at which about 640 seconds have elapsed since the start of heating. At time point t3, controller 60 determines the end of heating.

Thus, controller 60 causes high-frequency power supply 30 to stop to complete the heating, based on the rate of temporal change of the capacitance of first variable capacitor VC1, which is connected in series to first electrode 11. Note that in Examples 1 to 3, controller 60 may determine the end of heating at a time point slightly before time points t1, t2, and t3.

Figure 6:
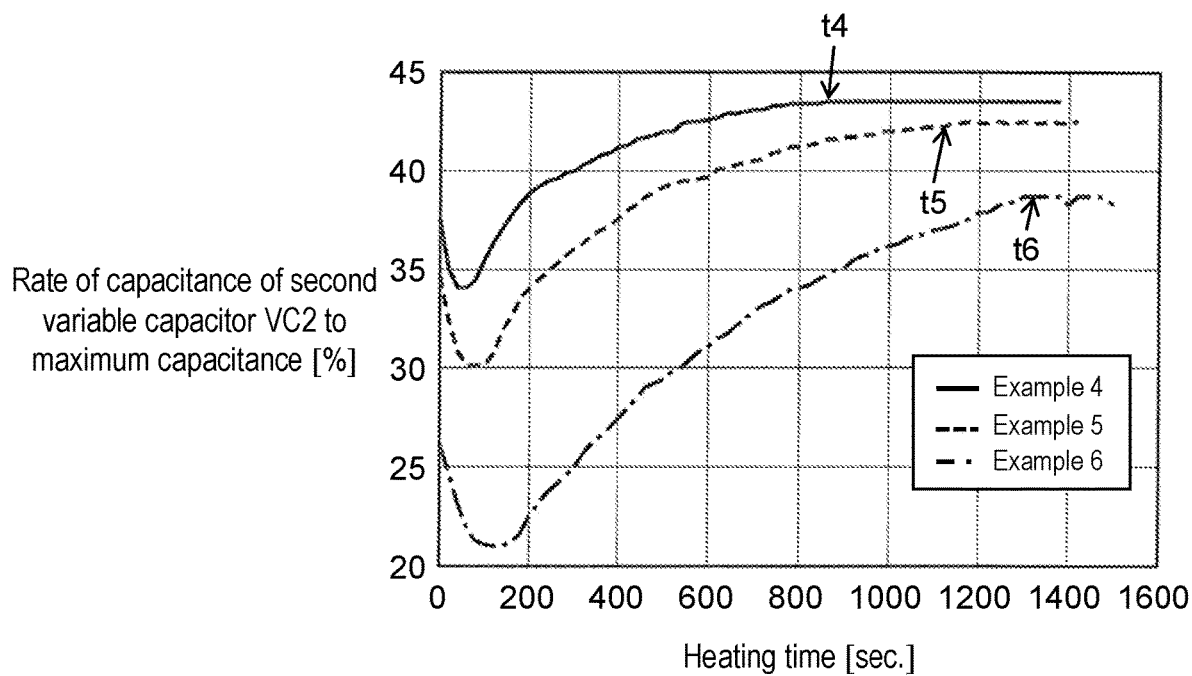
FIG. 6 is a graph showing a temporal change of the capacitance of second variable capacitor VC2 of Examples 4 to 6.

FIG. 6 shows a temporal change of the capacitance of second variable capacitor VC2 of Examples 4 to 6. Time points of the end of heating in Examples 4 to 6 are shown in FIG. 6.

More precisely, the vertical axis of FIG. 6 represents the rate (%) of capacitance of second variable capacitor VC2 that is determined by controller 60, with respect to the maximum capacitance of second variable capacitor VC2. As shown in FIG. 6, in Examples 4 to 6, the capacitance of second variable capacitor VC2 becomes stable with the progress of thawing of heating target 90. In other words, the rate of temporal change of the capacitance of second variable capacitor VC2 decreases.

In Examples 4 to 6, controller 60 determines the end of heating when the rate of temporal change of the capacitance of second variable capacitor VC2 reaches approximately 0%, more specifically, less than or equal to 0.1%. As shown in FIG. 6, in Example 4, the rate of temporal change of the capacitance of second variable capacitor VC2 is approximately 0% at time point t4, at which about 870 seconds have elapsed since the start of heating. At time point t4, controller 60 determines the end of heating.

In Example 5, the rate of temporal change of the capacitance of second variable capacitor VC2 is approximately 0% at time point t5, at which about 1130 seconds have elapsed since the start of heating. At time point t5, controller 60 determines the end of heating. In Example 6, the rate of temporal change of the capacitance of second variable capacitor VC2 is approximately 0% at time point t6, at which about 1310 seconds have elapsed since the start of heating. At time point t6, controller 60 determines the end of heating.

Thus, controller 60 causes high-frequency power supply 30 to stop to complete the heating, based on the rate of temporal change of the capacitance of second variable capacitor VC2, which is connected in parallel to first electrode 11. Note that in Examples 4 to 6, controller 60 may determine the end of heating at a time point slightly before time points t4 to t6.

Advantageous Effects

High-frequency heating apparatus 1 according to the present exemplary embodiment provides the following advantageous effects.

High-frequency heating apparatus 1 completes the heating based on a temporal change of a matching constant of a matching element included in impedance matcher 40. More specifically, controller 60 determines the end of heating when the rate of temporal change of the matching constant of the matching element becomes stable. For example, controller 60 causes high-frequency power supply 30 to stop to complete the heating when the matching constant is less than or equal to a predetermined threshold value.

According to the present exemplary embodiment, high-frequency heating apparatus 1 is able to perform impedance matching using impedance matcher 40 from the start to the end of heating of heating target 90. As a result, it is possible to determine the end of heating while suppressing the reflected wave from the electrode to high-frequency power supply 30. As a result, heating target 90 can be heated efficiently from the start to the end of heating.

Even in cases where there are variations in the position, shape, and mass of heating target 90, high-frequency heating apparatus 1 is able to complete the heating at an appropriate time point because the end of heating is determined based on the temporal change of the matching constant of the matching element.

High-frequency heating apparatus 1 employs the temporal change of the matching constant of a matching element included in impedance matcher 40 as the criterion for determining the end of heating. As a result, the end of heating can be determined easily. Even in cases where there are variations in the position, shape, and mass of the heating target 90, it is easy to set the threshold value.

The present exemplary embodiment illustrates that first electrode 11 is a flat-plate-shaped electrode having a rectangular shape. However, the shape of first electrode 11 is not limited to this shape. For example, first electrode 11 may have other shapes, such as a circular shape, an elliptic shape, or a polygonal shape. First electrode 11 may have some surface roughness on its surface, may have a bent portion at its periphery, and may be a perforated plate.

The present exemplary embodiment illustrates that second electrode 12 is disposed below first electrode 11. However, the present disclosure is not limited to this. It is desirable that first electrode 11 and second electrode 12 be disposed facing each other. For example, second electrode 12 may be disposed above first electrode 11. It is also possible that first electrode 11 and second electrode 12 may be disposed facing in a side-to-side axis direction.

The present exemplary embodiment illustrates that first electrode 11, second electrode 12, and position adjuster 20 are disposed in heating chamber 13. However, the present disclosure is not limited to this. It is also possible that position adjuster 20 may be disposed outside heating chamber 13.

The present exemplary embodiment illustrates that position adjuster 20 moves first electrode 11 vertically. However, the present disclosure is not limited to this. It is also possible that position adjuster 20 may move second electrode 12 vertically. Position adjuster 20 may move both first electrode 11 and second electrode 12 vertically.

The present exemplary embodiment illustrates that high-frequency power supply 30 includes high-frequency oscillator 31 and amplifiers 32 and 33, as illustrated in FIG. 2. However, high-frequency power supply 30 is not limited to the present exemplary embodiment, as long as high-frequency power supply 30 is able to apply a high-frequency power.

The present exemplary embodiment illustrates that high-frequency heating apparatus 1 includes position adjuster 20 and detector 50. However, high-frequency heating apparatus 1 may not be provided with position adjuster 20 or detector 50.

In the present exemplary embodiment, impedance matching between high-frequency power supply 30 and heating chamber 13 is performed by varying both the capacitances of first variable capacitor VC1 and second variable capacitor VC2. However, the present disclosure is not limited to this. It is also possible that impedance matching may be performed by fixing either one of the capacitance of first variable capacitor VC1 or the capacitance of second variable capacitor VC2 and varying only the other one of the capacitances.

The present exemplary embodiment illustrates that, as illustrated in FIG. 3, impedance matcher 40 includes first variable capacitor VC1 and second variable capacitor VC2 as the matching elements. However, the present disclosure is not limited to this.

It is sufficient as long as impedance matcher 40 includes at least one matching element that changes a matching constant in order to perform impedance matching between heating chamber 13 and high-frequency power supply 30. The at least one matching element may be an element having a matching constant that is variable. For example, the at least one matching element may include at least one of a variable capacitor and a variable inductor. Hereinbelow, modified examples of the impedance matcher will be described with reference to FIGS. 7A to 7E.

Figure 7A:
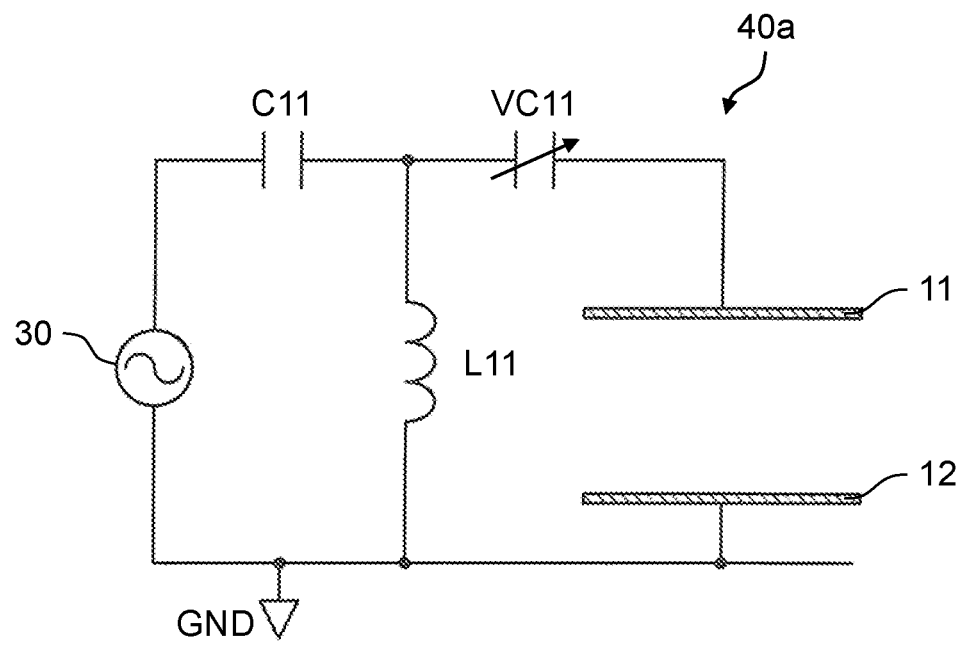
FIG. 7A is a schematic view illustrating a circuit model containing an impedance matcher of a first modified example.

FIG. 7A is a schematic view illustrating a circuit model containing impedance matcher 40a of a first modified example. As illustrated in FIG. 7A, impedance matcher 40a includes variable capacitor VC11, inductor L11, and capacitor C11. Impedance matcher 40a uses variable capacitor VC11 as the matching element.

Variable capacitor VC11 may be, for example, a vacuum variable capacitor. Variable capacitor VC11 is connected in series to first electrode 11. Capacitor C11 is connected in series to variable capacitor VC11 and high-frequency power supply 30. Inductor L11 is connected in parallel to first electrode 11.

Controller 60 varies the capacitance of variable capacitor VC11. This enables impedance matcher 40a to perform impedance matching between heating chamber 13 and high-frequency power supply 30.

Figure 7B:
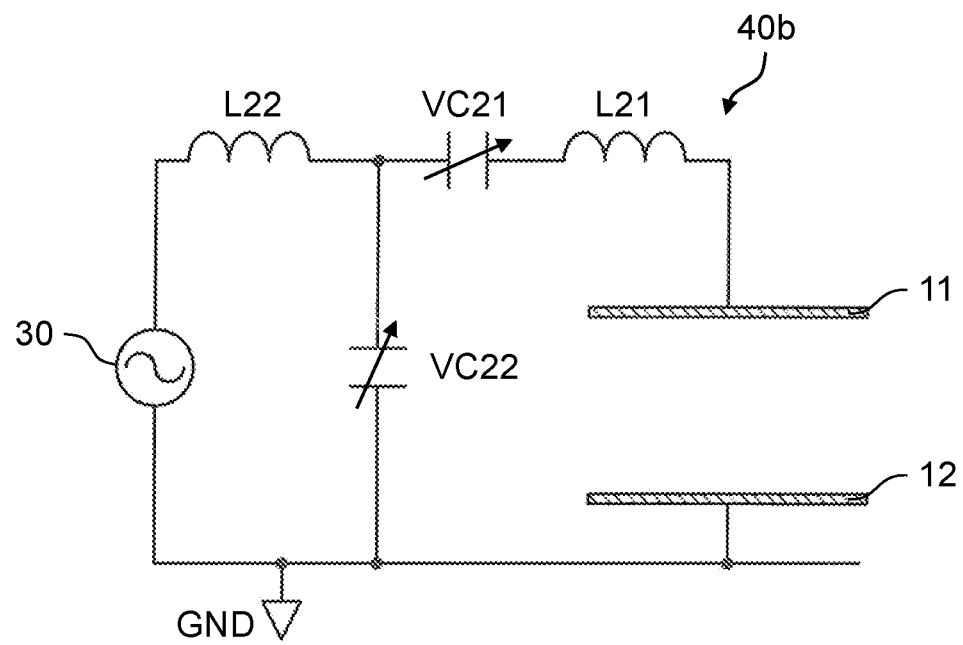
FIG. 7B is a schematic view illustrating a circuit model containing an impedance matcher of a second modified example.

FIG. 7B is a schematic view illustrating a circuit model containing impedance matcher 40b of a second modified example. As illustrated in FIG. 7B, impedance matcher 40b includes variable capacitor VC21, variable capacitor VC22, inductor L21, and inductor L22. Impedance matcher 40b uses variable capacitors VC21 and VC22 as the matching elements.

Each of variable capacitors VC21 and VC22 may be, for example, a vacuum variable capacitor. Variable capacitor VC21 is connected in series to first electrode 11. Variable capacitor VC22 is connected in parallel to first electrode 11. Inductor L21 is connected in series to variable capacitor VC21 and first electrode 11. Inductor L22 is connected in parallel to variable capacitor VC21 and high-frequency power supply 30.

Controller 60 varies at least one of the capacitances of variable capacitors VC21 and VC22. This enables impedance matcher 40b to perform impedance matching between heating chamber 13 and high-frequency power supply 30.

Figure 7C:
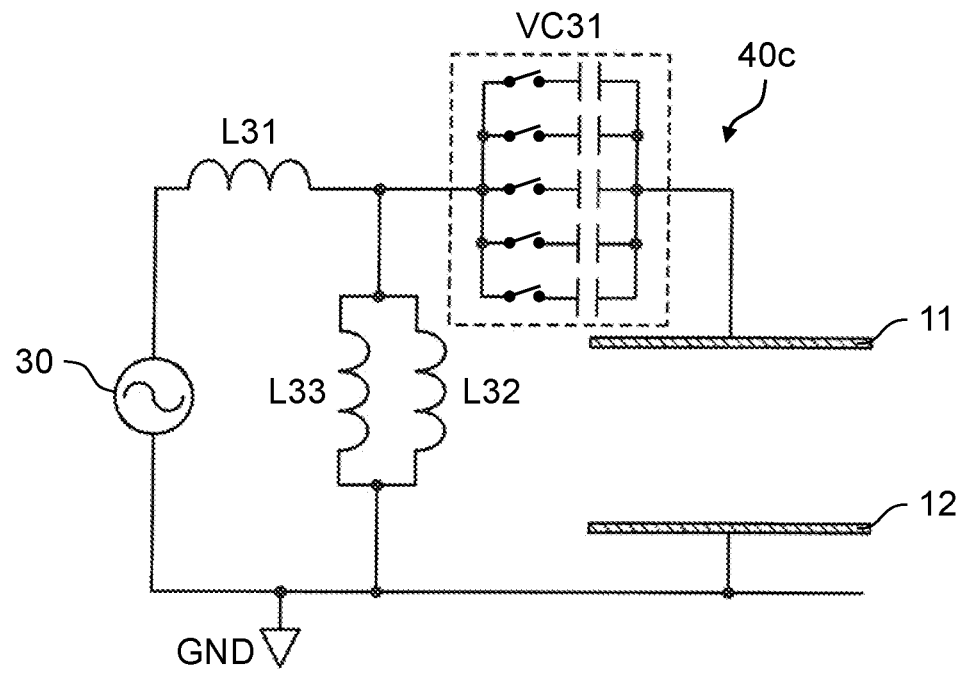
FIG. 7C is a schematic view illustrating a circuit model containing an impedance matcher of a third modified example.

FIG. 7C is a schematic view illustrating a circuit model containing impedance matcher 40c of a third modified example. As illustrated in FIG. 7C, impedance matcher 40c includes variable capacitor VC31 and inductors L31, L32, and L33. Impedance matcher 40c uses variable capacitor VC31 as the matching element.

Variable capacitor VC31 may be, for example, a switched capacitor. The switched capacitor includes a plurality of capacitors connected in parallel and a plurality of switches, each of which is connected in series to a corresponding one of the plurality of capacitors. When the plurality of capacitors are selectively connected by the plurality of switches, the capacitance of the switched capacitor changes.

Variable capacitor VC31 is connected in series to first electrode 11. Inductor L31 is connected in series to high-frequency power supply 30 and variable capacitor VC31. Inductor L32 and inductor L33 are connected in parallel to first electrode 11. Inductors L32 and L33 are connected in parallel to each other.

Controller 60 varies the capacitance of variable capacitor VC31 by selectively connecting the plurality of capacitors in the switched capacitor. This enables impedance matcher 40c to perform impedance matching.

Figure 7D:
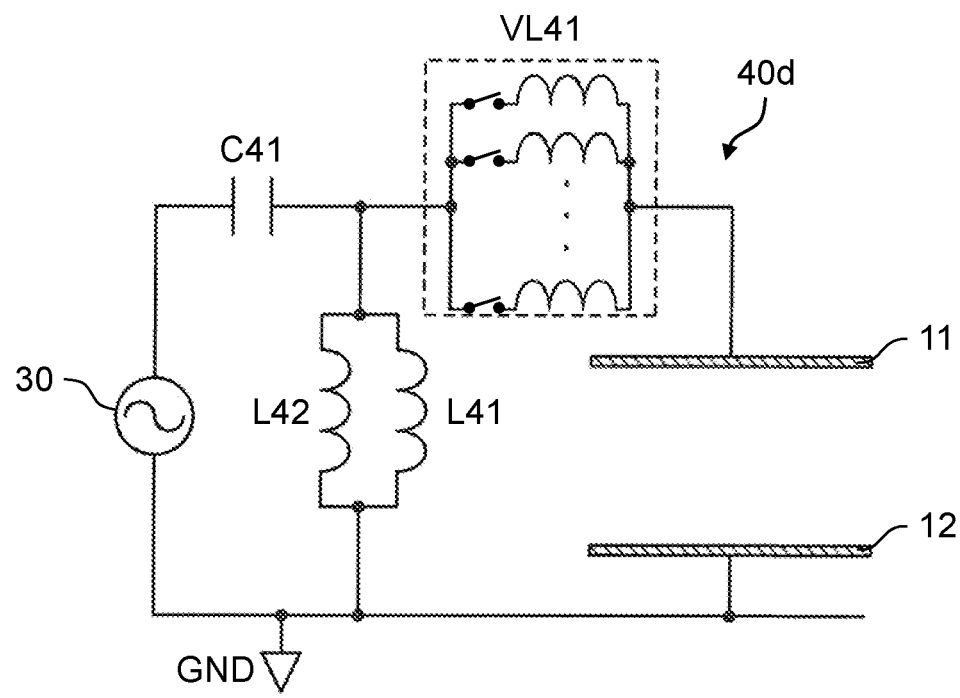
FIG. 7D is a schematic view illustrating a circuit model containing an impedance matcher of a fourth modified example.

FIG. 7D is a schematic view illustrating a circuit model containing impedance matcher 40d of a fourth modified example. As illustrated in FIG. 7D, impedance matcher 40d includes variable inductor VL41, capacitor C41, and inductors L41 and L42. Impedance matcher 40d uses variable inductor VL41 as the matching element.

Variable inductor VL41 includes a plurality of inductors connected in parallel and a plurality of switches, each of which is connected in series to a corresponding one of the plurality of inductors. When the plurality of inductors are selectively connected by the plurality of switches, the inductance of variable inductor VL41 changes.

Variable inductor VL41 is connected in series to first electrode 11. Capacitor C41 is connected in series to high-frequency power supply 30 and variable inductor VL41. Inductor L41 and inductor L42 are connected in parallel to first electrode 11. Inductors L41 and L42 are connected in parallel to each other.

Controller 60 varies the inductance of variable inductor VL41 by selectively connecting the plurality of inductors. This enables impedance matcher 40d to perform impedance matching.

Figure 7E:
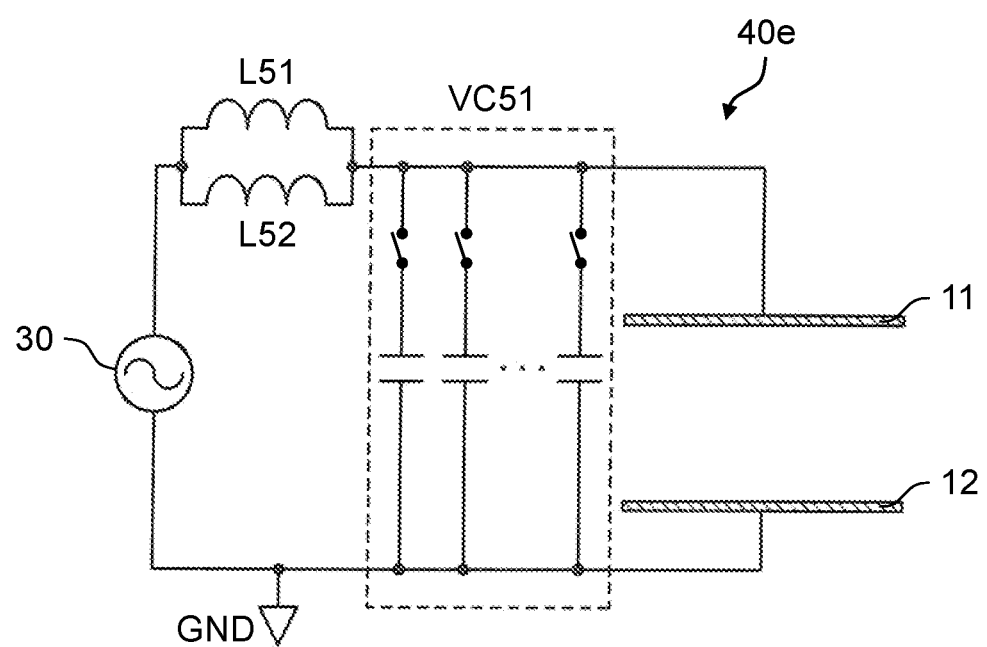
FIG. 7E is a schematic view illustrating a circuit model containing an impedance matcher of a fifth modified example.

FIG. 7E is a schematic view illustrating a circuit model containing impedance matcher 40e of a fifth modified example. As illustrated in FIG. 7E, impedance matcher 40e includes variable capacitor VC51 and inductors L51 and L52. Impedance matcher 40e uses variable capacitor VC51 as the matching element.

Variable capacitor VC51 may be, for example, a switched capacitor. Variable capacitor VC51 is connected in parallel to first electrode 11. Inductor L51 and inductor L52 are connected in series to high-frequency power supply 30 and variable capacitor VC51. Inductors L51 and L52 are connected in series to first electrode 11. Inductors L51 and L52 are connected in parallel to each other.

Controller 60 varies the capacitance of variable capacitor VC51 by selectively connecting the plurality of capacitors in the switched capacitor. This enables impedance matcher 40e to perform impedance matching.

A high-frequency heating apparatus that includes one of impedance matchers 40a to 40e is able to provide the same advantageous effects as high-frequency heating apparatus 1.

In the present exemplary embodiment, controller 60 causes high-frequency power supply 30 to stop to complete the heating when the rate of temporal change of the matching constant of the matching element is less than or equal to a predetermined threshold value. However, the present disclosure is not limited to this. For example, controller 60 may stop high-frequency power supply 30 when the matching constant does not change for 20 seconds or more, or for $\frac{1}{10}$ or more of the time during which heating is being performed. This makes it possible to determine the end of heating more accurately.

In the present exemplary embodiment, controller 60 may estimate the end time of heating from the temporal change of the matching constant of the matching element and stop high-frequency power supply 30 earlier than the estimated end time. For example, the end time of heating may be estimated from the temporal change of the matching constant by, for example, a least squares method.

This makes it possible to control the heating condition of heating target 90. For example, the heating may be completed before heating target 90 is thawed completely so as to finish heating target 90 in such a condition that it can be handled easily.

INDUSTRIAL APPLICABILITY

The high-frequency heating apparatus according to the present disclosure may be applicable to, for example, cooking appliances including a thawing machine.

REFERENCE MARKS IN THE DRAWINGS 1 high-frequency heating apparatus
11 first electrode 12 second electrode
13 heating chamber
20 position adjuster
30 high-frequency power supply
31 high-frequency oscillator
32, 33 amplifier
40, 40a, 40b, 40c, 40d, 40e impedance matcher
50 detector
60 controller
90 heating target

The invention claimed is:

1. A high-frequency heating apparatus comprising:
a heating chamber configured to accommodate a heating target;
an electrode;
a high-frequency power supply configured to apply a high-frequency voltage to the electrode;
an impedance matcher including at least one matching element having a matching constant that is variable; and
a controller configured to stop the high-frequency power supply to complete heating, when a rate of temporal change of the matching constant of the at least one matching element is less than or equal to a predetermined threshold,
wherein the controller is configured to estimate an end time of heating from the temporal change of the matching constant and stop the high-frequency power supply earlier than the end time, and
the controller is configured to vary the matching constant of the at least one matching element to maintain a combined impedance of an impedance of the impedance matcher and an impedance in the heating chamber.

2. The high-frequency heating apparatus according to claim 1, wherein the at least one matching element includes at least one of a variable capacitor having a variable capacitance and a variable inductor having a variable inductance.

3. The high-frequency heating apparatus according to claim 1, wherein:
the at least one matching element includes a plurality of capacitors; and
the impedance matcher changes the matching constant by selectively connecting the plurality of capacitors.

4. The high-frequency heating apparatus according to claim 1, wherein:
the at least one matching element includes a plurality of inductors; and
the impedance matcher changes the matching constant by selectively connecting the plurality of inductors.

5. The high-frequency heating apparatus according to claim 1, wherein the impedance matcher includes at least one matching element connected in series to the electrode, and at least one matching element connected in parallel to the electrode.

6. The high-frequency heating apparatus according to claim 1, wherein the at least one matching element is connected in series to the electrode.

7. The high-frequency heating apparatus according to claim 1, wherein the at least one matching element is connected in parallel to the electrode.

8. The high-frequency heating apparatus according to claim 1, wherein the impedance matcher changes the matching constant of the at least one matching element from start to end of heating, to suppress a reflected wave from the electrode to the high-frequency power supply.

9. The high-frequency heating apparatus according to claim 1, wherein the controller stops the high-frequency power supply when the matching constant does not change for 20 seconds or more, or for $1/10$ of a time during which heating is being performed.

* * * * *